(12) United States Patent
Ni et al.

(10) Patent No.: US 10,727,053 B2
(45) Date of Patent: Jul. 28, 2020

(54) METHOD OF FABRICATING SEMICONDUCTOR STRUCTURE

(71) Applicant: Suzhou Han Hua Semiconductor Co., Ltd, Suzhou (CN)

(72) Inventors: Xianfeng Ni, Suzhou (CN); Qian Fan, Suzhou (CN); Wei He, Suzhou (CN)

(73) Assignee: SUZHOU HAN HUA SEMICONDUCTOR CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 16/507,053

(22) Filed: Jul. 10, 2019

(65) Prior Publication Data

US 2019/0333766 A1   Oct. 31, 2019

(30) Foreign Application Priority Data

Jul. 13, 2018   (CN) .......................... 2018 1 0754483

(51) Int. Cl.
| | |
|---|---|
| *H01L 21/02* | (2006.01) |
| *H01L 29/06* | (2006.01) |
| *H01L 29/66* | (2006.01) |
| *H01L 29/778* | (2006.01) |
| *H01L 29/20* | (2006.01) |

(52) U.S. Cl.
CPC .... *H01L 21/02639* (2013.01); *H01L 21/0254* (2013.01); *H01L 21/02458* (2013.01); *H01L 29/0684* (2013.01); *H01L 29/66462* (2013.01); *H01L 21/0262* (2013.01); *H01L 21/02658* (2013.01)

(58) Field of Classification Search
None
See application file for complete search history.

(56) References Cited

U.S. PATENT DOCUMENTS

| | | | | |
|---|---|---|---|---|
| 2002/0123210 A1* | 9/2002 | Liu | ...................... | H01L 21/6836 438/459 |
| 2008/0299350 A1* | 12/2008 | Mezaki | ............... | B24B 37/0056 428/141 |
| 2010/0244041 A1* | 9/2010 | Oishi | .................. | H01L 29/0688 257/76 |
| 2013/0240896 A1* | 9/2013 | Ozaki | ................. | H01L 29/7786 257/76 |

(Continued)

FOREIGN PATENT DOCUMENTS

| | | |
|---|---|---|
| CN | 102130230 A | 7/2011 |
| CN | 105244377 A | 1/2016 |

*Primary Examiner* — Herve-Louis Y Assouman
(74) *Attorney, Agent, or Firm* — Westerman, Hattori, Daniels & Adrian, LLP

(57) ABSTRACT

A method of fabricating a semiconductor structure includes: growing a dielectric layer on a substrate; defining an epitaxial region and a gap region on the dielectric layer; etching a dielectric layer of the epitaxial region to expose the substrate; sequentially growing a gallium nitride buffer layer and an aluminum gallium nitride barrier layer on the exposed substrate. The method of fabricating a semiconductor structure provided by the present application divides the aluminum gallium nitride barrier layer into a plurality of independent portions, thus preventing the microcracks from occurring in the aluminum gallium nitrogen film while increasing the aluminum component, thereby improving the yield rate and reliability of the device.

9 Claims, 2 Drawing Sheets

(56) References Cited

U.S. PATENT DOCUMENTS

2014/0187004 A1\* 7/2014 Chun ............... H01L 29/66068
                                                           438/270
2017/0362739 A1\* 12/2017 Kajimoto ............. H01L 29/045

\* cited by examiner

METHOD OF FABRICATING SEMICONDUCTOR STRUCTURE

CROSS REFERENCE TO THE RELATED APPLICATIONS

This application is based upon and claims priority to Chinese Patent Application No. CN 201810754483.2, filed on Jul. 13, 2018, the entire contents of which are incorporated herein by reference.

TECHNICAL FIELD

The present invention relates to the field of semiconductor manufacturing technology, and in particular a method of fabricating a semiconductor structure.

BACKGROUND

As a representative of a third-generation semiconductor material, gallium nitride (GaN) has many excellent characteristics, for example, a high critical breakdown electric field, a high electron mobility ratio, a high two-dimensional electron gas concentration and a good high temperature working ability etc. A third-generation semiconductor device based on the gallium nitride, such as a high electron mobility transistor (HEMT) and a heterojunction field effect transistor (HFET) etc., has been put into applications, and has obvious advantages especially in the fields such as radio frequency and microwave etc., which require high power and high frequency.

In order to increase the two-dimensional electron gas concentration of a gallium nitride HEMT device, hence obtain a higher power of the device, the conventional method is to use an AlGaN/GaN-based HEMT having a high Al composition. However, increasing the composition of Al causes an AlGaN film to be under more tensile stress, if the tensile stress exceeds a certain extent, microcracks may occur in the AlGaN layer, resulting in a yield rate problem or a reliability problem of the HEMT device.

SUMMARY

Based on this, it is necessary to provide a method of fabricating a semiconductor structure for the problem of microcracks occurring in a barrier layer.

The present application provides a method of fabricating a semiconductor structure, including:

Growing a dielectric layer on a substrate;

Defining an epitaxial region and a gap region on the dielectric layer;

Etching the dielectric layer of the epitaxial region to expose the substrate;

Sequentially growing a gallium nitride buffer layer and an aluminum gallium nitride barrier layer on the exposed substrate.

In one embodiment, the step of defining the epitaxial region and the gap region on the dielectric layer comprises:

Coating a photoresist on the dielectric layer; and

Photoetching the photoresist based on a predetermined pattern to form the epitaxial region and the gap region.

In one embodiment, the step of growing the gallium nitride buffer layer on the exposed substrate comprises:

Cleaning and drying the substrate; and

Performing chemical vapor deposition of metal organics on the substrate.

In one embodiment, the epitaxial region is a discontinuous region, and the gap region is located between the epitaxial regions.

In one embodiment, the epitaxial region is rectangular.

In one embodiment, the rectangle has a length of 1 μm-100 μm and a width of 1 μm-100 μm.

In one embodiment, the gap region has a width of 1 μm-500 μm.

In one embodiment, the dielectric layer is a SiOx dielectric layer or a SiNx dielectric layer.

Accordingly, the present application also provides a semiconductor structure fabricated by any one of the above manufacturing methods.

The method of fabricating the semiconductor structure provided by the present application divides the aluminum gallium nitride barrier layer into a plurality of independent portions by setting the epitaxial region as a discontinuous region, thus preventing the microcracks from occurring in the aluminum gallium nitrogen film while increasing the aluminum component, thereby improving the yield rate and reliability of the device.

DETAILED DESCRIPTION OF THE EMBODIMENTS

A method of fabricating a semiconductor structure proposed by the present invention will be further described in detail below with reference to the figures and specific embodiments. Advantages and features of the present invention will be more clear with the below description and claims. It should be noted that the figures are in a very simplified form and all are in non-precise scale, only for the purpose of describing the embodiments of the present invention convenience and clarity to assist.

Figure 1:
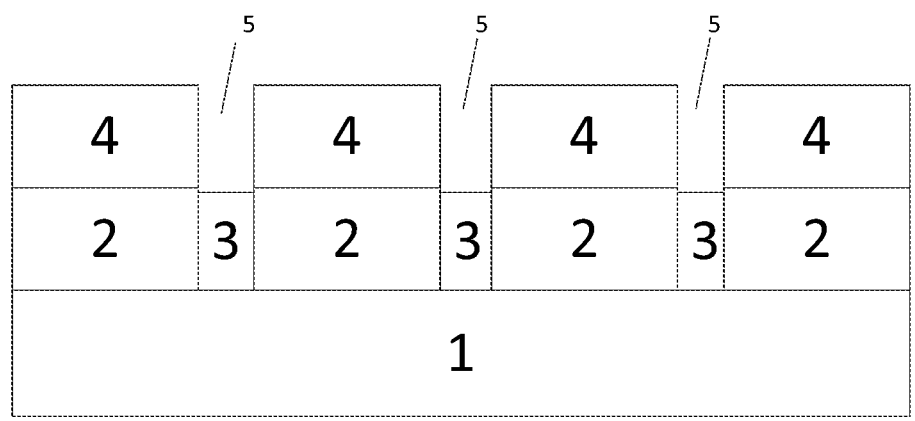
FIG. 1 is a cross-sectional view of a semiconductor structure in one embodiment.

Please refer to FIG. 1, the semiconductor structure provided in this embodiment is as shown in FIG. 1, and specifically includes a substrate 1, a gallium nitride buffer layer 2, a dielectric layer 3, and an aluminum gallium nitride barrier layer 4. The gallium nitride buffer layer 2 and the dielectric layer 3 are located on the substrate 1, and the gallium nitride buffer layer 2 and the dielectric layer 3 are both plural. A gap 5 is provided between the gallium nitride buffer layer 2, and the dielectric layer 3 is located in the gap 5 to form a structure in which the dielectric layer 3 and the gallium nitride buffer layer 2 are spaced apart from each other. The aluminum gallium nitride barrier layer 4 is located on the gallium nitride buffer layer 2, and the gap 5 separates the aluminum gallium nitride barrier layer 4, that is, the aluminum gallium nitride barrier layer 4 is present only at the locations where the gallium nitride buffer layer 2 also exists.

Materials of the substrate 1 include, but not limited to, silicon carbide, sapphire, and silicon. The dielectric layer 3 may be a dielectric material such as SiOx or SiNx. Depending on the nature of the nitride growth, the gallium nitride buffer layer and the aluminum gallium nitride material cannot continuously grow on the top of the dielectric layer 3, or only few discontinuous films can grow, and therefore, the aluminum gallium nitride barrier layer cannot be formed on the dielectric layer 3.

A method of fabricating a semiconductor device provided by the above embodiments is as shown in FIG. 2-FIG. 5, and the method includes:

S1: growing a dielectric layer 3 on a substrate 1.

Figure 2:
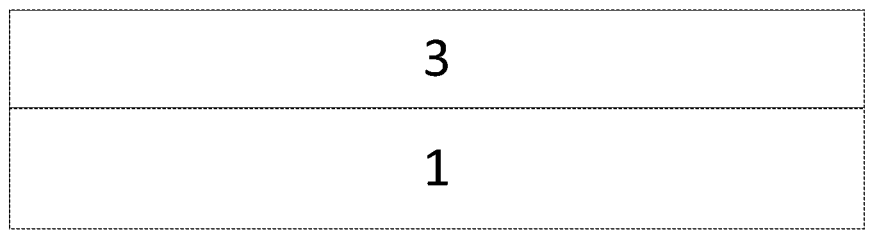
FIGS. 2-5 are schematic representations of fabricating a semiconductor structure according to some embodiments of the present invention.

The dielectric layer 3 may be grown on the substrate 1 by a chemical vapor deposition method. The dielectric layer 3 covers the surface of the substrate 1 to form a structure as shown in FIG. 2.

S2: defining an epitaxial region 31 and a gap region 32 on the dielectric layer 3.

Figure 3:
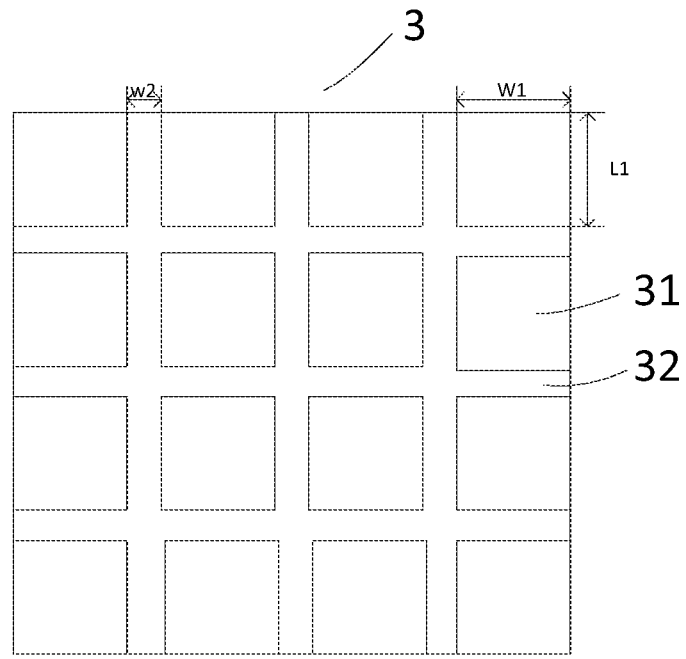
Figure 4:
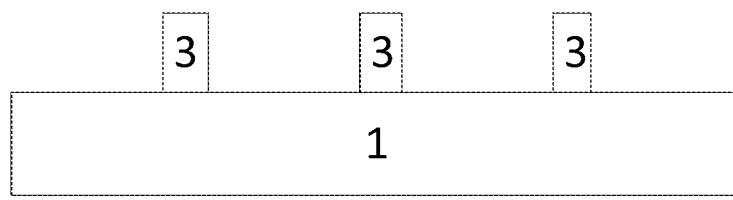

One layer of a photoresist is coated on the dielectric layer 3, and then a predetermined pattern is defined on the photoresist by means of exposure and development to form an epitaxial region 31 and a gap region 32. The pattern is as shown in FIG. 3, the epitaxial region 31 is a discontinuous region, and the gap region 32 is located between the epitaxial regions 31. In the present embodiment, the epitaxial region 31 is a rectangle, and has the length L1 and the width W1 that are both 1 μm-100 μm. The gap region 32 has the width w2 of 1 μm-500 μm. The size of the epitaxial region 31 and the width of the gap region 32 need to be optimized according to the composition of aluminum in the actual aluminum gallium nitride barrier layer. In other embodiments, other patterns may also be used, such as a circular or irregular pattern of the epitaxial regions.

S3: etching the dielectric layer 3 of the epitaxial region 31 to expose the substrate 1.

After the epitaxial region 31 is formed, the dielectric layer 3 of the epitaxial region 31 may be removed by a wet method or dry etching to expose the substrate 1 corresponding to the epitaxial region 31, and the specific conditions of the etching may be selected according to the material of the dielectric layer 3. In order to completely remove the dielectric layer of the epitaxial region 31, over-etching may be performed to ensure that the dielectric layer of the epitaxial region 31 is completely removed, leaving only the dielectric layer of the gap region 32. After the dielectric layer of the epitaxial region 31 is removed, the residual photoresist layer may be removed by means of a solvent to form a structure as described in FIG. 4.

S4: sequentially growing the gallium nitride buffer layer 2 and the aluminum gallium nitride barrier layer on the exposed substrate 1.

Figure 5:
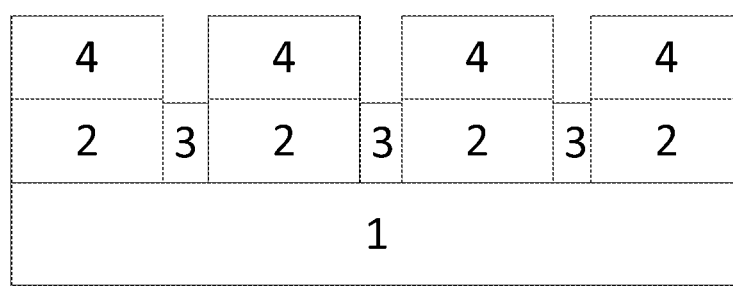

After the substrate of the epitaxial region 31 is exposed, the substrate 1 may be first cleaned with chemical agent such as acetone and methanol, and then dried by means of nitrogen, and the substrate 1 is then heated to a certain temperature (from 500° C. to 1100° C.) by means of metal organic chemical vapor deposition (MOCVD) in a gaseous environment (hydrogen or nitrogen or a mixture of hydrogen and nitrogen) or under vacuum. A gallium source (such as trimethylgallium or triethylgallium), ammonia, hydrogen, and nitrogen are provided into a reaction chamber, a nucleation layer (gallium nitride or aluminum nitride) and the gallium nitride buffer layer 2 are grown on the substrate 1. After the gallium nitride buffer layer 2 is grown, the aluminum gallium nitride barrier layer 4 is grown on the gallium nitride buffer layer 2, and the formed structure including the gallium nitride buffer layer 2 and the aluminum gallium nitride barrier layer 4 is as shown in FIG. 5. When the aluminum gallium nitride barrier layer 4 is grown, an aluminum source, a gallium source, an ammonia gas, a hydrogen gas, and a nitrogen gas are simultaneously introduced into the reaction chamber. The composition of aluminum in the aluminum gallium nitride barrier layer 4 can be controlled by the flow rate of the aluminum source and the gallium source. In other embodiments, one layer of 1-2 nm thick aluminum nitride spacer layer may be inserted between the aluminum gallium nitride barrier layer and the buffer layer. The addition of the aluminum nitride spacer layer can reduce the alloy scattering of the two-dimensional electron gas, thereby increasing the mobility of electrons.

When the aluminum gallium nitride barrier layer 4 is grown, the aluminum gallium nitride thin film cannot be grown on the dielectric layer 3 due to the selectivity of the high temperature MOCVD growth of the nitride material, therefore, the aluminum gallium nitride barrier layer 4 can only grow on the gallium nitride buffer layer 2. And since the gallium nitride buffer layer 2 is separated, the aluminum gallium nitride barrier layer 4 is also divided into a plurality of discontinuous portions. Since the aluminum gallium nitride barrier layer 4 is discontinuous, the stress of the aluminum gallium nitride barrier layer 4 can be reduced, and the aluminum component can be increased without increasing the risk of microcracking, thereby improving the yield and reliability of the device.

The technical features of the above-described embodiments may be arbitrarily combined, for the sake of brevity of description, not all possible combinations of the technical features in the above embodiments are described, however, as long as there is no contradiction among the combinations of these technical features, all these should be considered as the scope of the record of the description.

The above-described ones are merely illustrative of several embodiments of the present invention, and the description thereof is more specific and detailed, but is not to be construed as limiting the scope of the invention. It should be noted that numerous adaptions and modifications thereof may be readily apparent to those skilled in the art without departing from the spirit and scope of the present invention. Therefore, the scope of the present invention should be determined by the attached claims.

The invention claimed is:

1. A method of fabricating a semiconductor structure for fabricating a HEMT device, comprising:
   growing a dielectric layer on a substrate;
   defining an epitaxial region and a gap region on the dielectric layer, wherein the epitaxial region comprises a plurality of discontinuous epitaxial sub-regions, and the gap region is located between the discontinuous epitaxial sub-regions;
   etching the dielectric layer of the epitaxial region to expose the substrate;
   sequentially growing a gallium nitride buffer layer and an aluminum gallium nitride barrier layer on an exposed area of the substrate, thereby dividing the aluminum gallium nitride barrier layer and the gallium nitride buffer layer into a plurality of discontinuous portions.

2. The method of fabricating the semiconductor structure for fabricating the HEMT device according to claim 1, wherein the step of defining the epitaxial region and the gap region on the dielectric layer comprises:
   coating a photoresist on the dielectric layer;
   photoetching the photoresist in a predetermined pattern tf formthe epitaxial region and the gap region.

3. The method of fabricating the semiconductor structure for fabricating the HEMT device according to claim 1, wherein the step of growing a gallium nitride buffer layer on the exposed substrate comprises:
   cleaning and drying the substrate;

performing metal-organic chemical vapor deposition on the substrate.

4. The method of fabricating the semiconductor structure for fabricating the HEMT device according to claim 1, wherein the epitaxial region is a rectangle.

5. The method of fabricating the semiconductor structure for fabricating the HEMT device according to claim 4, wherein a length of the rectangle is 1 μm-100 μm and a width of the rectangle is 1 μm-100 μm.

6. The method of fabricating the semiconductor structure for fabricating the HEMT device according to claim 1, wherein a width of the gap region is 1 μm to 500 μm.

7. The method of fabricating the semiconductor structure for fabricating the HEMT device according to claim 1, wherein the dielectric layer is a $SiO_x$ dielectric layer or a $SiN_x$ dielectric layer.

8. A method of fabricating a semiconductor structure for fabricating a HEMT device, comprising:
   growing a dielectric layer on a substrate;
   defining an epitaxial region and a gap region on the dielectric layer, wherein the epitaxial region comprises a plurality of discontinuous epitaxial sub-regions, and the gap region is located between the discontinuous epitaxial sub-regions;
   etching the dielectric layer of the epitaxial region to expose the substrate;
   sequentially growing a gallium nitride buffer layer, an aluminum nitride spacer layer, and an aluminum gallium nitride barrier layer on an exposed area of the substrate, thereby dividing the aluminum gallium nitride barrier layer, the aluminum nitride spacer layer, and the gallium nitride buffer layer into a plurality of discontinuous portions.

9. The method of fabricating the semiconductor structure for fabricating the HEMT device according to claim 8, wherein a thickness of the aluminum nitride spacer layer is 1 nm to 2 nm.

* * * * *